US007006879B2

(12) United States Patent
Ishizaka

(10) Patent No.: US 7,006,879 B2
(45) Date of Patent: Feb. 28, 2006

(54) BORING METHOD FOR CIRCUIT BOARD

(75) Inventor: Hitoshi Ishizaka, Osaka (JP)

(73) Assignee: Nitto Denko Corporation, Osaka (JP)

(*) Notice: Subject to any disclaimer, the term of this patent is extended or adjusted under 35 U.S.C. 154(b) by 640 days.

(21) Appl. No.: 09/983,082

(22) Filed: Oct. 23, 2001

(65) Prior Publication Data
US 2002/0050055 A1 May 2, 2002

(30) Foreign Application Priority Data
Oct. 26, 2000 (JP) ............... P. 2000-326608

(51) Int. Cl.
G06F 15/46 (2006.01)
(52) U.S. Cl. ............... 700/57; 700/58; 700/160; 700/194; 408/16
(58) Field of Classification Search ............ 700/57, 700/58, 160, 194; 408/1 R, 3, 16
See application file for complete search history.

(56) References Cited

U.S. PATENT DOCUMENTS

| | | | | |
|---|---|---|---|---|
| 4,790,694 A | * | 12/1988 | Wilent et al. | 408/1 R |
| 5,111,406 A | * | 5/1992 | Zachman et al. | 700/160 |
| 5,347,462 A | * | 9/1994 | Okuda et al. | 700/192 |
| 5,377,404 A | * | 1/1995 | Berg | 29/830 |
| 5,529,441 A | * | 6/1996 | Kosmowski et al. | 408/1 R |
| 6,205,364 B1 | * | 3/2001 | Lichtenstein et al. | 700/58 |
| 6,567,713 B1 | * | 5/2003 | Lichtenstein et al. | 700/58 |

FOREIGN PATENT DOCUMENTS

JP 8-155796 6/1996

\* cited by examiner

Primary Examiner—Leo Picard
Assistant Examiner—Douglas S. Lee
(74) Attorney, Agent, or Firm—Sughrue Mion, PLLC

(57) ABSTRACT

In a separate process from a boring process, the prealignment is performed beforehand on the circuit board, employing an alignment device, to create the positional data indicating the position of boring the hole in a pattern within the circuit board. In the boring process, the circuit board is carried into the working apparatus. The panel alignment is made on the circuit board. The positional data for positioning the circuit board on a table of the working apparatus is created. The synthesis of the positional data created by the prealignment and the positional data created by the panel alignment is performed to calculate the boring position of the circuit board on the table. The hole is bored at the calculated position in the circuit board, employing a boring machine of the working apparatus. Thereafter, the circuit board is carried out from the working apparatus.

4 Claims, 6 Drawing Sheets

BORING METHOD FOR CIRCUIT BOARD

CROSS REFERENCE TO THE RELATED APPLICATION

This application is based on Japanese patent publication No. 2000-326608, which is incorporated herein by reference.

BACKGROUND OF THE INVENTION

1. Field of the Invention

The present invention relates to a boring method for a circuit board.

2. Description of Related Art

A flexible printed circuit board is employed to make the electronic devices lighter in weight, thinner and shorter. If the flexible printed circuit board is employed, the line for transferring an electrical signal can be arranged at higher density than using the wire. Therefore, the flexible printed circuit board is increasingly employed as an electrical coupling member to produce the electronic devices that are made lighter in weight, thinner and shorter.

With the miniaturization of electronic devices, it is important that the pattern is formed at high precision and fineness in the flexible printed circuit board (hereinafter abbreviated as a circuit board). As the number of signal lines increases, the circuit board is required to be multi-layered. Thus, various methods have been proposed to effect the interlayer connection of multi-layered circuit board.

A method for making the interlayer connection of the multi-layered circuit board generally employs the through-hole plating. In the through-hole plating, a through hole is formed in the circuit board, and the inner face of the through hole is plated. The through hole for the through hole plating is formed employing a working apparatus having a boring machine such as a drill machine, a punching machine, or a laser beam machine.

The working apparatus has an alignment function for aligning the boring position of the through hole in the circuit board. Therefore, the working apparatus is provided with a CCD (Charge Coupled Device) camera, a lens system, an illumination system, and a movement mechanism, in addition to the boring machine such as a drill machine, a punching machine, or a laser beam machine.

The alignment involves recognizing an alignment mark attached onto the actual circuit board, and conducting computation to correct an error between the position of through hole in the design data and the boring position of through hole in the actual circuit board, on the basis of the position of recognized alignment mark.

Lately, a working apparatus has been developed having a function of correcting errors in the horizontal direction, vertical direction and the rotational direction, as well as comparing the distance between alignment marks in the actual circuit board with the distance between alignment marks in the design data, and correcting the design data in accordance with the ratio of elongation or contraction if the actual circuit board is elongated or contracted. Such a correction is called as the scaling. The positioning of hole in the actual circuit board is conducted on the basis of the corrected design data.

The alignment of the circuit board is performed at two stages of a panel alignment and a pattern alignment, as described below. The panel alignment involves positioning the circuit board on a table of the working apparatus. Also, the pattern alignment involves positioning the hole in the pattern within the circuit board.

FIG. 7 is a flowchart showing a boring method for the conventional flexible printed circuit board.

As shown in FIG. 7, first of all, a circuit board is carried into the working apparatus (step S11). Then, the panel alignment for positioning the circuit board carried in on the table of the working apparatus is performed (step S12). The panel alignment involves picking up an image of the circuit board using a CCD camera of the working apparatus, detecting the alignment mark attached onto the circuit board on the basis of the obtained image, and positioning the circuit board on the table of the working apparatus with reference to the position of the alignment mark.

Next, the pattern alignment is performed to position the hole in the pattern of the circuit board positioned on the table of the working apparatus (step S13). This pattern alignment involves detecting a plurality of alignment marks attached onto the circuit board, modifying errors between the boring position in the actual circuit board and the boring position in the design data, comparing the distance between alignment marks in the actual circuit board with the distance between alignment marks in the design data, and detecting the presence or absence of elongation or contraction of the actual circuit board. If the circuit board is elongated or contracted, the scaling is performed to correct the design data in accordance with its ratio of elongation or contraction. Thereby, the position of boring the hole in the actual circuit board is corrected.

Thereafter, the circuit board is bored, employing the boring machine of the working apparatus (step S14). Lastly, the circuit board is carried out from the working apparatus (step S15).

A thin material such as a flexible printed circuit board often has a distortion component of elongation or contraction or other distortion components. Therefore, in boring, it is required to correct the position of boring by scaling, on the basis of the design data corresponding to the distortion of the circuit board, as described above.

The circuit board is composed of two kinds of materials including a metal part and a resin part for forming a circuit. In particular, the metal part may be possibly subjected to permanent deformation due to a stress applied in a manufacturing process. If a region subjected to permanent deformation and other region are mixed, the degree of elongation or contraction of the circuit board may vary partly. Also, the circuit board may be elongated or contracted anisotropically, or locally.

In such a case, even if the scaling is uniformly applied on the entire circuit board, it is impossible to correct the position of boring in each region precisely. Therefore, it is necessary to reduce the unit of area for making the pattern alignment. If the unit of area for making the pattern alignment is reduced, the precision of the boring position may be improved, but the number of pattern alignments increases accordingly. As a result, it takes more time to make the pattern alignment, decreasing the production efficiency. In this way, the production efficiency and the positional precision of boring contradict.

SUMMARY OF THE INVENTION

It is an object of the present invention to provide a boring method for a circuit board which can improve the positional precision of boring while shortening the positioning time of boring.

According to the present invention, there is provided a boring method for a circuit board to bore a hole at a predetermined position in the circuit board, characterized by including a first step of acquiring the first position data for positioning the hole in the circuit board employing a positioning device having an image pick-up function, a second step of boring the hole in the circuit board, using a working apparatus having the image pick-up function and a boring function, the second step further including a sub-step of acquiring the second position data for positioning the circuit board in the working apparatus by the image pick-up function of the working apparatus, a sub-step of determining the boring position of the circuit board in the working apparatus by synthesizing the first position data acquired at the first step and the second position data, and a sub-step of boring the hole at a predetermined position of the circuit board by the boring function of the working apparatus.

In the boring method according to the invention, the first position data is obtained for positioning the hole in the circuit board, employing the positioning device at the first step. Also, at the second step, the second position data is obtained for positioning the circuit board in the working apparatus by the image pick-up function of the working apparatus. The boring position of the circuit board in the working apparatus can be obtained by synthesizing the first position data obtained at the first step and the second position data. Thus, the hole is bored at a predetermined position in the circuit board by the boring function of the working apparatus.

In this way, the first position data for positioning the hole in the circuit board is obtained at the first step apart from the second step, whereby it is possible to shorten the time required for the second step to bore the hole.

The first step is performed employing the positioning device which can operate at higher speed than the working apparatus used at the second step, whereby it is possible to shorten the time required for the first step.

In this case, the total of the time required to obtain the first position data at the first step, the time required to obtain the second position data at the second step, and the time required to synthesize the first and second position data at the second step is shorter than the total of the time required for the panel alignment using the working apparatus with the conventional method and the time required for the pattern alignment. As a result, the total production time of the circuit board is shortened.

In case of boring the holes in a plurality of circuit boards, since the first step is performed employing the positioning device, and the second step is performed employing the working apparatus, the acquisition of the second position data and the synthesis of the first and second position data in one circuit board are performed, while the first position data for other circuit board is acquired. Accordingly, it is possible to shorten greatly the time required to bore the holes in the plurality of circuit board.

The circuit board has a first positioning mark that is the positional reference for boring the hole in a pattern within the circuit board and a second positioning mark that is the positional reference for the circuit board in the working apparatus, wherein the first step includes a sub-step of acquiring the first position data on the basis of the first positioning mark and the second positioning mark obtained by picking up the image of the first positioning mark and the second positioning mark on the circuit board by the image pick-up function of the positioning device, and wherein the sub-step of acquiring the second position data in the second step includes acquiring the second position data on the basis of the position of the second positioning mark obtained by picking up the image of the second positioning mark on the circuit board by the image pick-up function of the working apparatus.

In this case, the first step includes picking up the image of the first positioning mark and the second positioning mark on the circuit board by the image pick-up function of the positioning device, and acquiring the first position data on the basis of the first positioning mark and the second positioning mark obtained. The second step includes picking up the image of the second positioning mark on the circuit board by the image pick-up function of the working apparatus, and acquiring the second position data on the basis of the second positioning mark obtained.

The positioning device comprises a first image pick-up unit for picking up an image of the circuit board, a first data processing unit for processing the first position data on the basis of the image of the circuit board obtained by the first image pick-up unit, and a movement unit for moving the circuit board relative to the first image pick-up unit, wherein the working apparatus comprises a second image pick-up unit for picking up an image of the circuit board, a second data processing unit for processing the second position data on the basis of the image of the circuit board obtained by the second image pick-up unit as well as synthesizing the first position data and the second position data, a second movement unit for moving the circuit board relative to the second image pick-up unit, and a boring unit for boring a hole in the circuit board on the basis of the first and second position data synthesized by the second data processing unit.

In this case, the positioning device has the first image pick-up unit, the first data processing unit and the first movement unit, and does not have boring unit. Therefore, the positioning unit is reduced in weight and can operate at higher speed. Accordingly, the time required for the first step can be reduced.

Also, the working apparatus has the second image pick-up unit, the second data processing unit, the second movement unit and the boring unit, and thereby can generate the second position data, synthesize the first and second position data, and bore the hole.

DETAILED DESCRIPTION OF THE PREFERRED EMBODIMENTS

Figure 1:
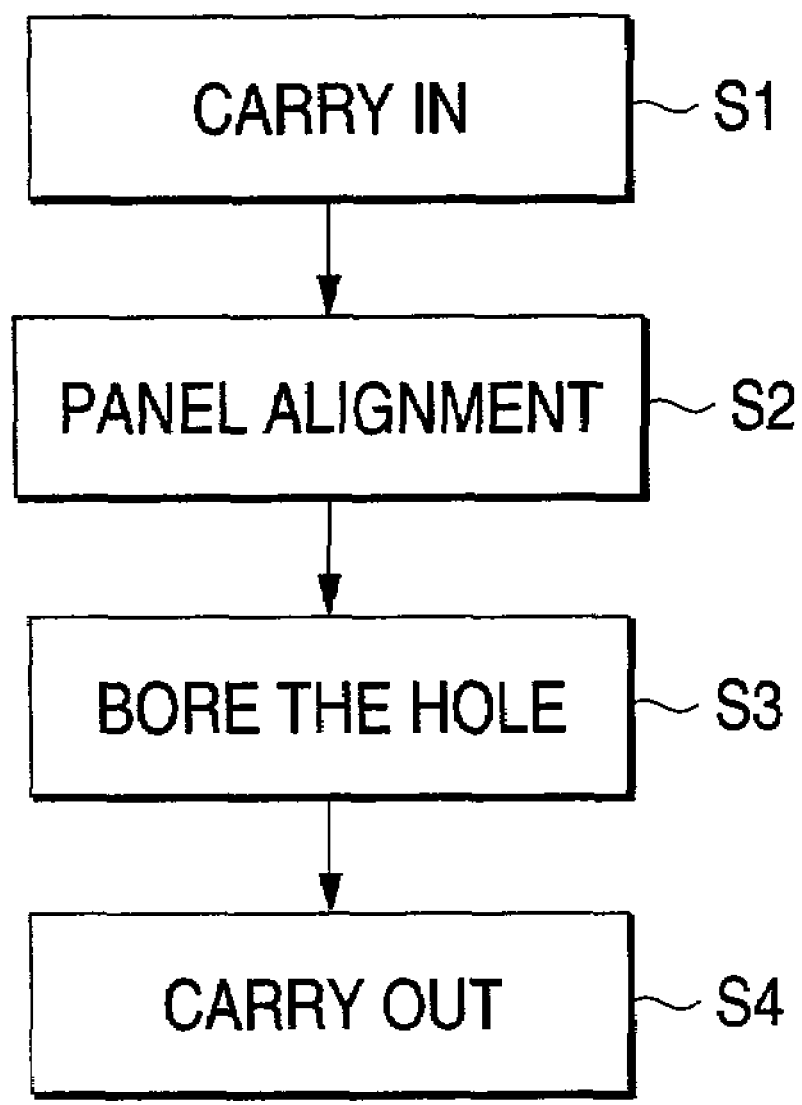
FIG. 1 is a flowchart showing a boring process in a boring method for a flexible printed circuit board according to one embodiment of the present invention.
Figure 2A:
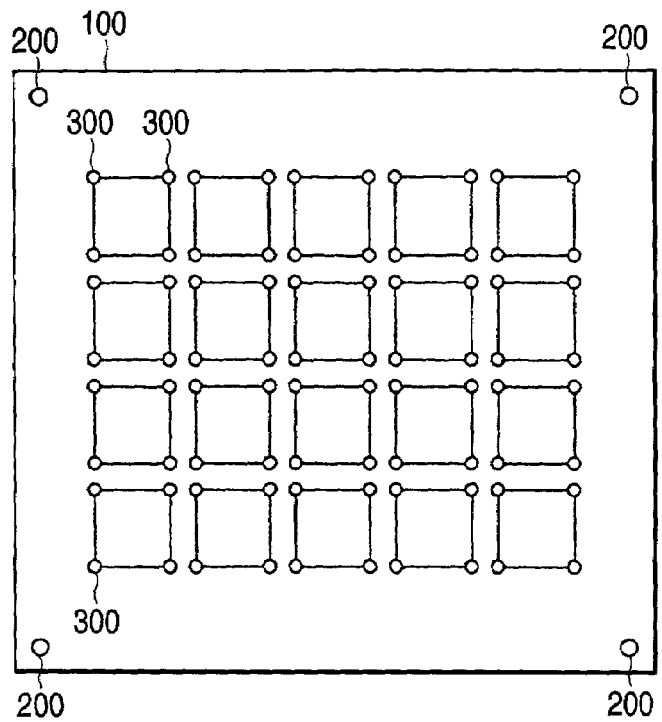
FIGS. 2A and 2B are plan views illustrating an example of alignment marks in the flexible printed circuit board.
Figure 2B:
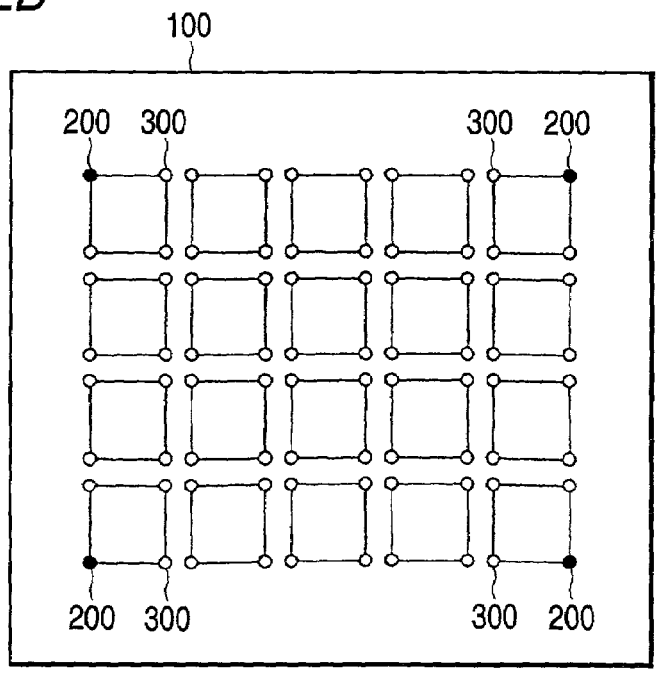

FIG. 1 is a flowchart showing a boring process with a boring method for a flexible printed circuit board according to one embodiment of the present invention. FIGS. 2A and 2B are plan views illustrating an example of the alignment mark in the flexible printed circuit board.

In the boring method of this embodiment, the pattern alignment (hereinafter referred to as a prealignment) is performed beforehand on the flexible printed circuit board (hereinafter abbreviated as a circuit board) employing an alignment device, in a separate process from the boring process. Thereby, the alignment time in the boring process can be shortened. Herein, the prealignment corresponds to a first process and the boring process corresponds to a second process.

The alignment device has a CCD camera, a lens system, an illumination system, a movement mechanism and a control computer, in the same manner as a working apparatus as will be described later, but does not have a boring machine such as a drill machine, a punching machine or a laser beam machine. Therefore, the movement mechanism is reduced in weight, and the movement speed can be higher than the working apparatus. Herein, an alignment mark 300 corresponds to a first positioning mark, and an alignment mark 200 corresponds to a second positioning mark.

In FIG. 2A, a circuit board 100 has four alignment marks 200 for the panel alignment and a plurality of alignment marks 300 for the pattern alignment.

In an example of FIG. 2B, the circuit board 100 also four alignment marks 200 for the panel alignment and a plurality of alignment marks 300 for the pattern alignment. The four alignment marks 200 for the panel alignment also serve as the alignment marks 300 for the pattern alignment.

In the prealignment, plural alignment marks 200, 300 attached onto the circuit board 100 are detected employing the alignment device, the design data is corrected on the basis of those alignment marks 200, 300, and the first position data is produced indicating the boring position in the pattern within the circuit board 100 with reference to the alignment marks 200, 300.

In the boring process as shown in FIG. 1, first of all, the circuit board 100 that is a workpiece is carried into the working apparatus (step S1). Then, the panel alignment for positioning the circuit board 100 carried in on the table of the working apparatus is performed (step S2). The panel alignment involves picking up an image of the circuit board 100 using a CCD camera of the working apparatus, detecting the alignment mark 200 for the panel alignment on the basis of the obtained image, creating the second position data concerning the alignment mark 200, and positioning the circuit board 100 on the table of the working apparatus on the basis of the created second position data.

Further, the first position data created by the prealignment in the separate process and the second position data created by the panel alignment are synthesized to calculate the boring position in the pattern of the circuit board 100 on the table, then boring is performed at the calculated position, employing the boring machine of the working apparatus (step S3). Thereafter, the circuit board 100 is carried out from the working apparatus (step S4).

In the boring method of this embodiment, since the prealignment is made in the separate process from the boring process, the time required for the boring process can be shortened. This prealignment can be effected, using the alignment device that can operate at higher speed than the working apparatus, thereby shortening the time required for the prealignment.

In this case, the sum of the time required for the prealignment in the separate process and the time required for the data synthesis in the boring process is shorter than the time required for the pattern alignment in the conventional boring process. Accordingly, the sum of the time required for the prealignment in the separate process, the time required for the panel alignment in the boring process and the time required for the synthesis of positional data is shorter than the sum of the time required for the panel alignment and the time required for the pattern alignment in the conventional boring process. As a result, with the boring method of this embodiment, the total production time of the circuit board 100 can be shortened.

Figure 3A:
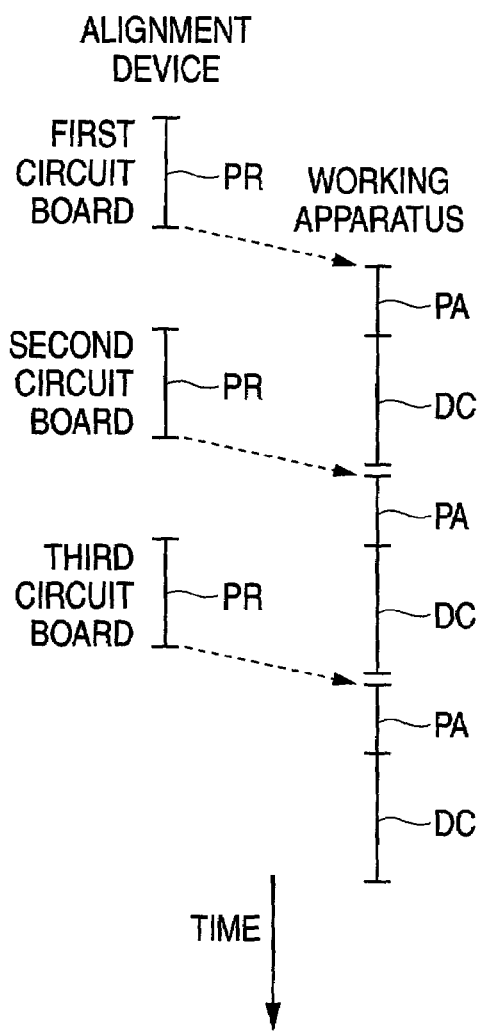
FIGS. 3A and 3B are schematic diagrams showing the comparison between the processing time for boring the holes in a plurality of circuit boards using the boring method of this embodiment and that of the conventional boring method.
Figure 3B:
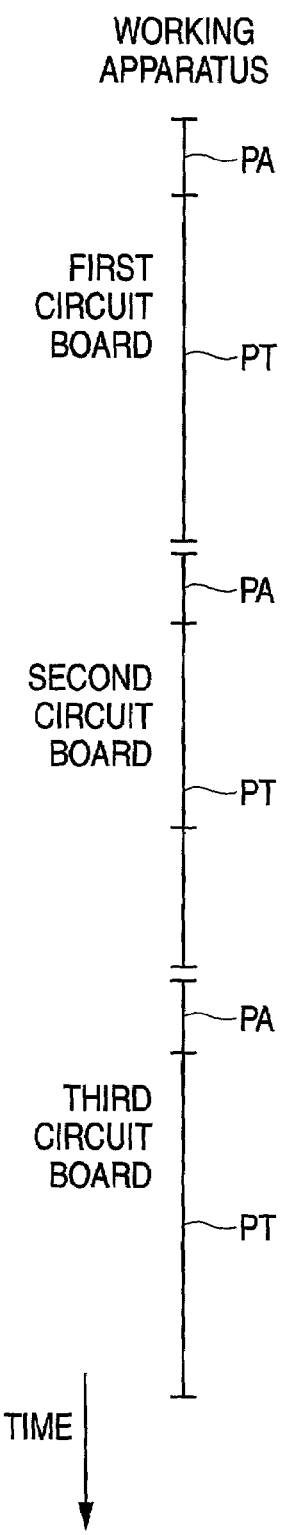

FIGS. 3A and 3B are schematic diagrams showing the processing time for effecting the boring in a plurality of circuit boards, employing the boring method of this embodiment, as compared with the processing time for effecting the boring in a plurality of circuit boards, employing the conventional boring method.

FIG. 3A shows the processing time for boring the holes in three circuit boards employing the boring method of this embodiment, and FIG. 3B shows the processing time for boring the holes in three circuit boards employing the conventional boring method. In FIGS. 3A and 3B, reference symbol PR denotes the prealignment, PA denotes the panel alignment, and DC denotes the synthesis of the first and second positional data (hereinafter referred to as data synthesis). Also, reference symbol PT denotes the pattern alignment.

In the boring method of this embodiment as shown in FIG. 3A, the prealignment PR is performed using the alignment device, and the panel alignment PA and the data synthesis DC are performed using the working apparatus, therefore the prealignment PR for the second circuit board can be performed in parallel with the panel alignment PA and the data synthesis DC for the first circuit board. Similarly, the prealignment PR for the third circuit board can be performed in parallel with the panel alignment PA and the data synthesis DC for the second circuit board.

On the other hand, in the conventional boring method as shown in FIG. 3B, the panel alignment PA and the pattern alignment PT are performed employing the same working apparatus, therefore the panel alignment PA and the pattern alignment PT for the second circuit board can not be performed, before the panel alignment PA and the pattern alignment PT for the first circuit board are ended. Similarly, the panel alignment PA and the pattern alignment PT for the third circuit board can not be performed, before the panel alignment PA and the pattern alignment PT for the second circuit board are ended.

As described above, the sum of the time required for the prealignment PR and the time required for the data synthesis DC is shorter than the time required for the pattern alignment PT in the conventional boring method.

Consequently, when boring the holes in a plurality of circuit boards, the boring method of this embodiment has the total processing time greatly shorter than with the conventional working method.

In the boring method of this embodiment, when the positional data acquired by the prealignment in the separate process and the positional data acquired by the pattern alignment in the boring process are synthesized, it is necessary that the positional data of prealignment and the positional data of panel alignment correspond to the same circuit board 100. Thus, using the following method, the positional data of prealignment occurring in the separate process is associated with the printed circuit board 100 to bore the hole in the boring process.

As a first method, the first positional data of prealignment and the circuit board 100 are designated with the same serial number. In this case, the circuit board 100 has the serial number printed by laser marker or printing.

As a second method, four alignment marks 200 for the panel alignment and a plurality of alignment marks 300 for the pattern alignment as shown in FIGS. 2A and 2B are positioned in making the prealignment in the separate process, and four alignment marks 200 for the panel alignment in the circuit board 100 as well as one or more alignment marks 300 for the pattern alignment are positioned in making the panel alignment in the boring process, whereby the first positional data for prealignment is associated with the circuit board 100 on the basis of the positional relation between the alignment marks 200 for the panel alignment and the alignment marks 300 for the pattern alignment.

Next, the alignment device and the working apparatus used in the boring method of this embodiment will be exemplified below.

Figure 4:
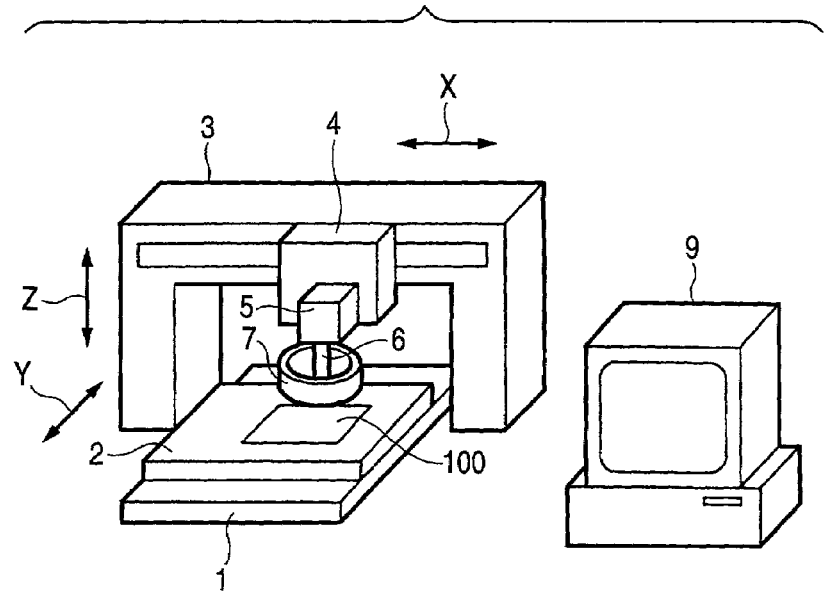
FIG. 4 is a schematic perspective view illustrating a first example of an alignment device or a working apparatus for use with the boring method of this embodiment.

FIG. 4 is a typical perspective view illustrating a first example of an alignment device or a working apparatus for use with the boring method of this embodiment. This alignment device or working apparatus is a batch type.

In FIG. 4, three directions orthogonal to each other are defined as an X-axis direction as indicated by the arrow X, a Y-axis direction as indicated by the arrow Y, and a Z-axis direction as indicated by the arrow Z. A Y-axis table 1 is provided movably in the Y-axis direction.

A suction table 2 with a suction mechanism is installed on the Y-axis table 1. A circuit board 100 is placed on the suction table 2. The suction table 2 consists of a glass plate, for example. A suction hole is formed at a predetermined position on the suction table 2, and an air suction blower (not shown) is connected via a hose (not shown) under the suction hole. The hose has an electromagnetic valve (not shown) inserted. By opening or closing the electromagnetic valve, the suction of the circuit board 100 into the suction table 2 can be turned on or off.

There are some cases where the circuit board 100 is difficult to separate from the suction table 2 due to electrostatic suction after it is once sucked to the suction table 2, depending on the kind of the circuit board 100. In such a case, the circuit board 2 can be easily separated from the suction table 2 by supplying a compressed air via the hose to the suction table 2.

A fixed arm 3 is provided with an X-axis moving portion 4 that is movable in the X-axis direction. Further, the X-axis moving portion 4 is provided with a CCD (Charge Coupled Device) camera 5 that is movable in the Z-axis direction. The CCD camera 5 is mounted with a lens system 6 and an LED (Light Emitting Diode) ring illumination 7. A control computer 9 controls the movement of the Y-axis table 1, the X-axis moving portion 4 and the CCD camera 5, picking up the image by the CCD camera 5, turning on or off the LED ring illumination 7, and the creation of positional data.

In this way, the CCD camera 5 is movable in the X-axis direction, the Y-axis direction and the Z-axis direction with respect to the circuit board 100.

The working apparatus is provided with a boring machine (not shown) such as a drill machine, a punching machine or a laser beam machine to bore the hole, in addition to a constitution of FIG. 4. On the other hand, the alignment device is not provided with the boring machine.

In the alignment device or working apparatus of this embodiment, the Y-axis table 1 is provided independently from the fixed arm 3 and the X-axis moving portion 4 to relieve the weight on the Y-axis table 1. Thereby, the movement speeds of the circuit board 100 in the X-axis direction, the Y-axis direction and the Z-axis direction are increased.

In the alignment device or working apparatus of FIG. 4, the CCD camera 5 corresponds to first or second image pick-up unit, the Y-axis table 1, the fixed arm 3 and the X-axis moving portion 4 correspond to first or second movement unit, and the control computer 9 corresponds to first or second data processing unit.

Figure 5:
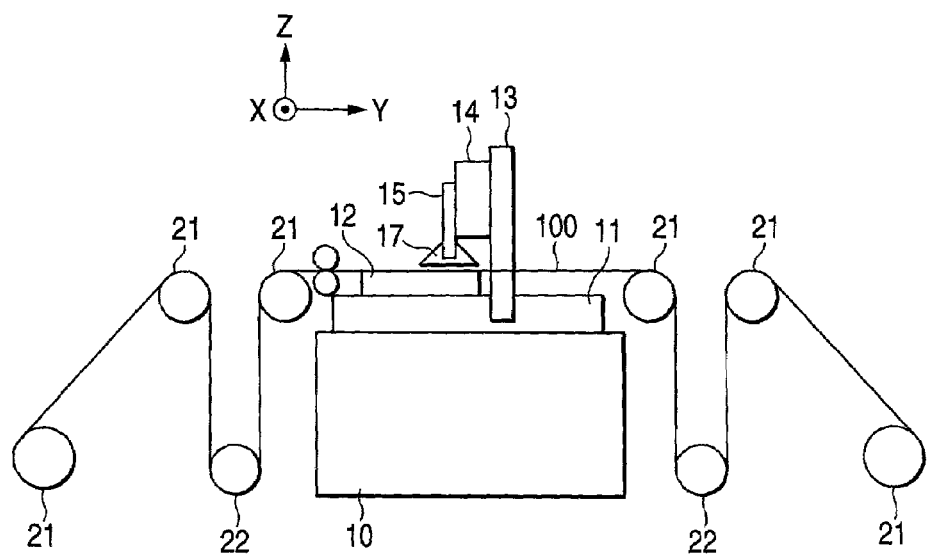
FIG. 5 is a schematic side view illustrating a second example of an alignment device or a working apparatus for use with the boring method of this embodiment.

FIG. 5 is a typical side view illustrating a second example of the alignment device or working apparatus for use with the boring method of this embodiment.

The alignment device or working apparatus of FIG. 5 is provided with an automatic conveying device for conveying a long circuit board 100. A Y-axis table 11 is provided on a fixed basement 10 to be movable in the Y-axis direction.

A suction table 12 with a suction mechanism is provided on the Y-axis table 11, like the alignment device or working apparatus of FIG. 4. The circuit board 100 is laid on the suction table 12.

The fixed arm 13 is provided with the X-axis moving portion 14 that is movable in the X-axis direction. Further, the X-axis moving portion 14 is provided with a CCD camera 15 that is movable in the Z-axis direction. The CCD camera 15 is mounted with a lens system (not shown) and an LED ring illumination 17.

In this way, the CCD camera 15 is movable in the X-axis direction, the Y-axis direction and the Z-axis direction with respect to the circuit board 100.

The working apparatus is provided with a boring machine (not shown) such as a drill machine, a punching machine or a laser beam machine to bore the hole, in addition to a constitution of FIG. 5. On the other hand, the alignment device is not provided with the boring machine. In FIG. 5, the control computer (see FIG. 4) is not shown.

An automatic conveying device comprises a plurality of conveying rolls 21 and a pair of dancer rolls 22. The automatic conveying device has a conveying direction coincident with the Y-axis direction. The dancer rolls 22 moved up or down with the movement of the Y-axis table 11 to relieve a tensile stress on the long circuit board 100.

In particular, the conveying rolls 21 and the dancer rolls 22 are reduced in weight with lower inertia moment, the load on the Y-axis table 11 can be relieved, when moving the circuit board 100 in the Y-axis direction. Thereby, the table settlement time (time required to make the Y-axis table 11 still) can be decreased.

In the alignment device or working apparatus of FIG. 5, the CCD camera 15 corresponds to first or second image pick-up unit, the Y-axis table 11, the fixed arm 13 and the X-axis moving portion 14 correspond to first or second movement unit, and the control computer 9 of FIG. 4 corresponds to first or second data processing unit.

Figure 6:
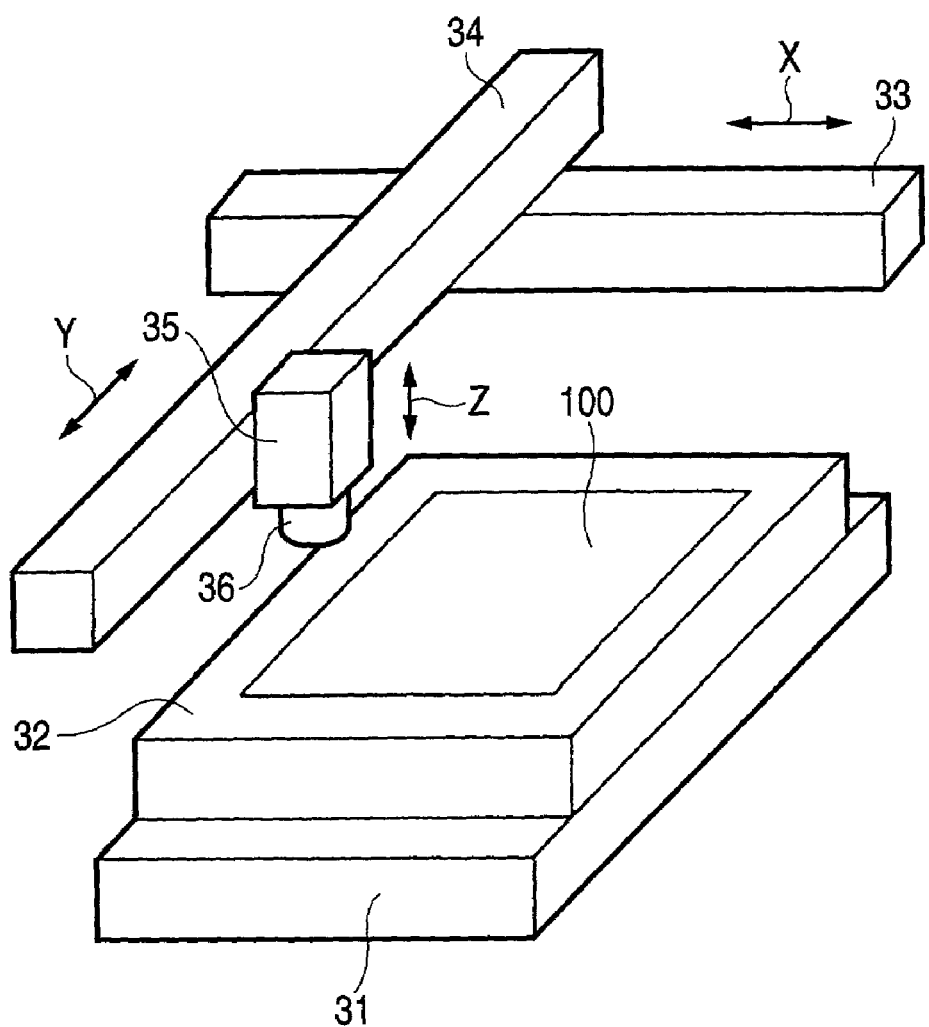
FIG. 6 is a schematic perspective view illustrating a second example of an alignment device or a working apparatus for use with the boring method of this embodiment.
Figure 7:
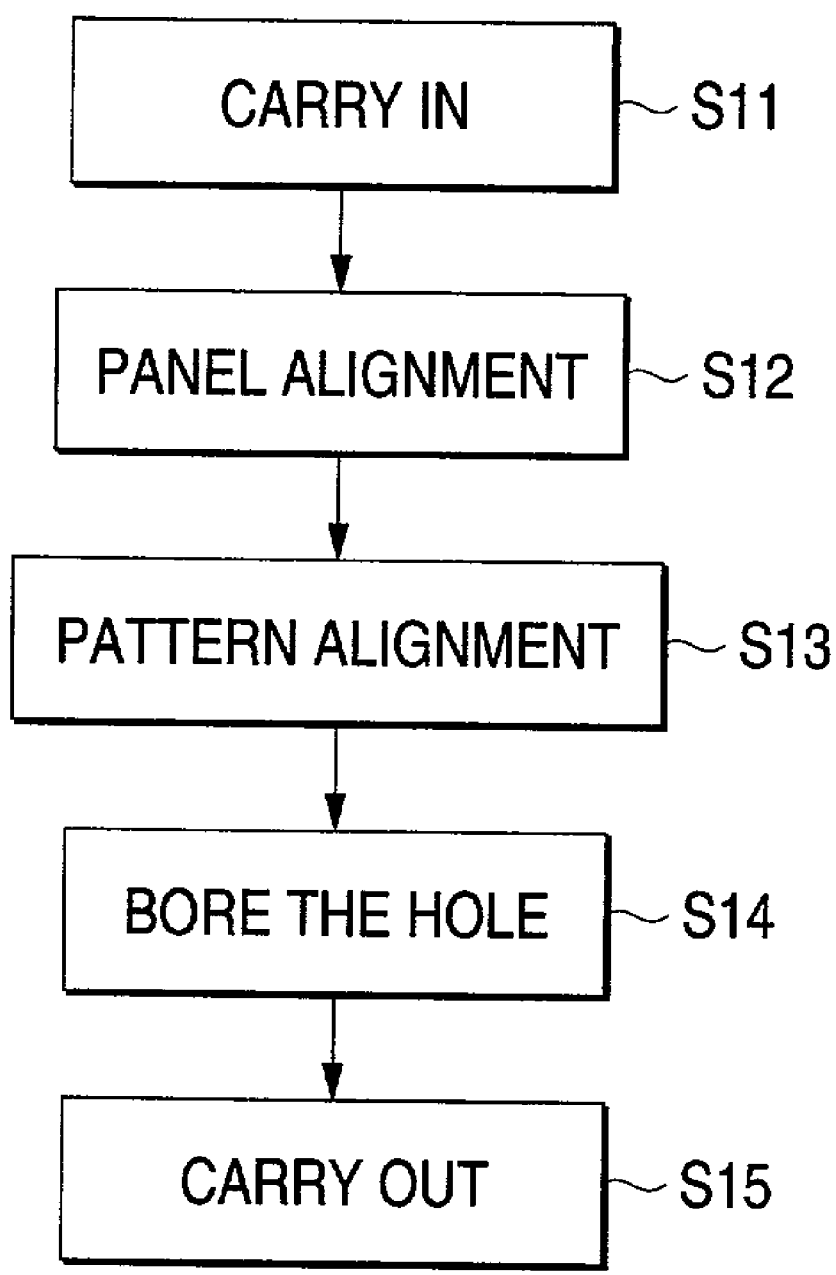
FIG. 7 is a flowchart showing a conventional boring method of the flexible printed circuit board.

FIG. 6 is a typical perspective view illustrating a third example of the alignment device or working apparatus for use with the boring method of this embodiment.

The alignment device or working apparatus of FIG. 6 is provided with a suction table 32 with a suction mechanism on an operation table 31 which is fixed. An X-axis arm 33 is provided to be movable in the X-axis direction with respect to a Y-axis arm 34. The Y-axis arm 34 is provided to be movable in the Y-axis direction with respect to the X-axis arm 33. Further, a CCD camera 35 is provided to be movable in the Z-axis direction with respect to the Y-axis arm 34. The CCD camera 35 is mounted with a lens system 36 and an LED ring illumination (not shown).

The weight of the operation table 31 and the suction table 32 has no effect on the operation of the X-axis arm 33 and the Y-axis arm 34. Therefore, the movement speed of the X-axis arm 33 and the Y-axis arm 34 can be increased.

The working apparatus is provided with a boring machine (not shown) such as a drill machine, a punching machine or a laser beam machine to bore the hole, in addition to a constitution of FIG. 6. On the other hand, the alignment device is not provided with the boring machine. In FIG. 6, the control computer (see FIG. 4) is not shown.

The alignment device or working apparatus of the third embodiment may be constituted in the batch type as in the first embodiment, or provided with an automatic conveying device as in the second embodiment. In the alignment device or working apparatus of the third embodiment, because the operation table 31 is fixed, there is particularly no need of reducing the weight of the conveying rolls 21 and the dancer rolls 22, when the automatic conveying device of the third embodiment is provided.

In the alignment device or working apparatus of FIG. 6, the CCD camera 35 corresponds to first or second image pick-up unit, the X-axis arm 33 and the Y-axis arm 34 correspond to first or second movement unit, and the control computer 9 of FIG. 4 corresponds to first or second data processing unit.

EXAMPLES

The alignment time was measured in accordance with the methods of the examples 1 to 3 and the comparative examples as below.

Example 1

In an example 1, after a circuit board 100 was prealigned in a separate process, employing an alignment device of FIG. 4, the circuit board 100 was subjected to panel alignment and data synthesis in a boring process using the working apparatus of FIG. 4 with a laser beam machine.

The speed of the Y-axis table 1 was set at a maximum of 200 mm/second, and about one hundred alignment marks on the circuit board 100 as large as 500 mm×500 mm were acquired. It took 8 seconds to make the panel alignment, 20 seconds for the data synthesis, and a total of 28 seconds. The time required for the prealignment was 110 seconds.

Comparative Example

In a comparative example, no prealignment was made, and the circuit board 100 was subjected to panel alignment and pattern alignment in the boring process employing the working apparatus of FIG. 4.

The speed of the Y-axis table 1 was set at a maximum of 200 mm/second, and about one hundred alignment marks on the circuit board 100 as large as 500 mm×500 mm were acquired. It took 8 seconds to make the panel alignment, 121 seconds for the pattern alignment, and a total of 129 seconds.

Example 2

In an example 2, after a long circuit board 100 was prealigned in a separate process, employing an alignment device of FIG. 5, the long circuit board 100 was subjected to panel alignment and data synthesis in a boring process using the working apparatus of FIG. 5 with a laser beam machine.

About one hundred alignment marks on the long circuit board 100 as large as 500 mm×500 mm were acquired. It took 8 seconds to make the panel alignment, 20 seconds for the data synthesis, and a total of 28 seconds. The time required for the prealignment was 115 seconds.

In the example 2, the time required for setting the circuit board 100 on the suction table 12 can be reduced by employing the automatic conveying device. In the case where the circuit board 100 is manually set without use of the automatic conveying device, the setting time is about 30 seconds, while when the automatic conveying device is employed, the setting time of the circuit board 100 can be shortened to 8 seconds. In this way, the automatic conveying device can increase the productivity significantly.

Example 3

In an example 3, after a circuit board 100 was prealigned in a separate process, employing an alignment device of FIG. 6, the circuit board 100 was subjected to panel alignment and data synthesis in a boring process using the working apparatus of FIG. 6 with a laser beam machine.

About one hundred alignment marks on the circuit board 100 as large as 500 mm×500 mm were acquired. In the example 3, the movement speed of the X-axis arm 33 and the Y-axis arm 34 could be increased up to 600 mm/second. Thereby, the speed of panel alignment, particularly prealignment, could be increased as compared with when the working apparatus of the examples 1 and 2 is employed. It took 7 seconds to make the panel alignment, 20 seconds for the data synthesis, and a total of 27 seconds. The time required for the prealignment was 70 seconds.

In this way, in the examples 1 to 3, when the same number of alignment marks are acquired, the time required for the alignment can be reduced significantly, as compared with the comparative example.

In the examples 1 to 3, when the time required for the alignment is the same, a greater number of alignment marks can be acquired than in the comparative example.

Accordingly, the positional precision of boring and the time of boring in the manufacture of the circuit board can be improved, and a production system for the circuit board with high quality and low costs can be realized.

The boring method of the circuit board according to the invention is not limited to the flexible printed circuit board, but can be applied to other circuit boards such as rigid printed circuit board.

What is claimed is:

1. A method for boring a hole in a circuit board, comprising the steps of:
    a first step of acquiring a first position data for positioning the hole in said circuit board, employing a positioning device having an image pick-up function;
    a second step of boring the hole in said circuit board, employing a working apparatus having an image pick-up function and a boring function, said second step further including:
        a sub-step of acquiring a second position data for positioning said circuit board in said working apparatus, by said image pick-up function of said working apparatus;
        a sub-step of determining the boring position on said circuit board in said working apparatus by synthesizing the first position data acquired in said first step and said second position data; and a sub-step of boring the hole at a predetermined position in said circuit board by said boring function of said working apparatus.

2. A method for boring a hole in a circuit board according to claim 1, wherein said circuit board has a first positioning mark that is the positional reference for boring the hole in a pattern within said circuit board, and a second positioning mark that is the positional reference of said circuit board in said working apparatus, wherein said first step includes a sub-step of acquiring said first position data on the basis of said first positioning mark and said second positioning mark obtained by picking up the image of said first positioning mark and said second positioning mark on said circuit board by said image pick-up function of said positioning device, and wherein said sub-step of acquiring said second position data in said second step includes acquiring said second position data on the basis of the position of said second positioning mark obtained by picking up the image of said second positioning mark on said circuit board by said image pick-up function of said working apparatus.

3. A method for boring a hole in a circuit board according to claim 1, further comprising the steps of, a first picking up step for picking up an image of said circuit board by a first image pick-up unit provided in said positioning device, a first data processing step for processing said first position data on the basis of the image of said circuit board obtained in said first image pick up process, and a second moving step for moving said circuit board relative to said first image pick-up unit, a second picking up step for picking up an image of said circuit board by a second image pick-up unit in said working apparatus, a second data processing step for processing said second position data on the basis of the image of said circuit board obtained by said second image pick-up unit as well as synthesizing said first position data and said second position data, a second moving step for moving said circuit board relative to said second image pick-up unit, and boring a hole in said circuit board on the basis of said first and second position data synthesized in said second data processing process.

4. A boring device for a circuit board comprising:

a positioning device including a first image pick-up unit for picking up an image of said circuit board, a first data processing unit for providing a first position data on the basis of said image obtained by said first image pick-up unit, and a movement unit for moving said circuit board relative to said first image pick-up unit; and a working apparatus including a second image pick-up unit for picking up an image of said circuit board, a second data processing unit for providing a second position data on the basis of said image obtained by said second image pick-up unit as well as synthesizing said first position data and said second position data, a second movement unit for moving said circuit board relative to said second image pick-up unit, and a boring unit for boring a hole in said circuit board on the basis of said first and second position data synthesized by said second data processing unit.

* * * * *